US008663505B2

(12) United States Patent
Loevenich et al.

(10) Patent No.: US 8,663,505 B2
(45) Date of Patent: *Mar. 4, 2014

(54) PROCESS FOR PRODUCING CONDUCTING POLYMERS

(75) Inventors: Wilfried Loevenich, Bergisch-Gladbach (DE); Rudolf Hill, Langenfeld (DE); Andreas Elschner, Mühlheim (DE); Friedrich Jonas, Aachen (DE); Udo Guntermann, Krefeld (DE)

(73) Assignee: Heraeus Precious Metals GmbH & Co. KG (DE)

(*) Notice: Subject to any disclaimer, the term of this patent is extended or adjusted under 35 U.S.C. 154(b) by 674 days.

This patent is subject to a terminal disclaimer.

(21) Appl. No.: 12/676,530

(22) PCT Filed: Aug. 27, 2008

(86) PCT No.: PCT/EP2008/061213
§ 371 (c)(1),
(2), (4) Date: Jun. 22, 2010

(87) PCT Pub. No.: WO2009/030615
PCT Pub. Date: Mar. 12, 2009

(65) Prior Publication Data
US 2011/0024692 A1 Feb. 3, 2011

(30) Foreign Application Priority Data
Sep. 4, 2007 (DE) .................. 10 2007 041 722

(51) Int. Cl.
H01B 1/12 (2006.01)
C09D 5/24 (2006.01)
C09D 125/18 (2006.01)
C09D 165/00 (2006.01)

(52) U.S. Cl.
USPC .......................... 252/500; 528/378

(58) Field of Classification Search
USPC .................. 252/500; 528/373–378
See application file for complete search history.

(56) References Cited

U.S. PATENT DOCUMENTS

| 4,959,430 A | 9/1990 | Jonas et al. |
| 4,987,042 A | 1/1991 | Jonas et al. |
| 5,035,926 A | 7/1991 | Jonas et al. |
| 5,079,302 A * | 1/1992 | Lee et al. ............ 525/256 |
| 5,300,575 A | 4/1994 | Jonas et al. |
| 5,792,830 A * | 8/1998 | Noding et al. ........ 528/422 |
| 7,008,562 B2 | 3/2006 | Jonas et al. |
| 7,116,549 B2 * | 10/2006 | Anzai et al. ........ 361/530 |
| 2003/0164477 A1 * | 9/2003 | Zhou et al. ......... 252/500 |
| 2006/0071201 A1 | 4/2006 | Jonas et al. |
| 2007/0085061 A1 | 4/2007 | Elder et al. |
| 2012/0175565 A1 * | 7/2012 | Lovenich et al. ..... 252/500 |

FOREIGN PATENT DOCUMENTS

| CA | 2148544 A1 | 11/1995 |
| CN | 1839448 A | 9/2006 |
| EP | 0339340 A2 | 11/1989 |
| EP | 0440957 A2 | 8/1991 |
| EP | 0686662 A2 | 12/1995 |
| EP | 1323764 A1 | 7/2003 |
| EP | 1373356 B1 | 5/2005 |
| JP | 2001-323137 A | 11/2001 |
| JP | 2006-328276 A | 12/2006 |
| WO | WO-03/048227 A1 | 6/2003 |
| WO | WO-2004/114326 A1 | 12/2004 |

OTHER PUBLICATIONS

Groenendaal et al., "Poly (3,-ethyleneioxthiophene) and its derivative: past, present, and future," Adv. Mater., 2000, vol. 12, , pp. 481-494.

Houben Weyl, Methoden der organi-schen Chemie, vol. E 20, Makromolekulare Stoffe, Part 2, 1987, pp. 1141, 1158, 1162, 1188, 1231-1232.

Kim et al, "Enhancement of electrical conductivity of poly (3, 4-ethyenedioythiophene)/ poly(4-stryenesulfonate) by a change of solvents," Synthetic Metals, 2002, vol. 126, pp. 311-316.

Ouyang et al., "On the mechanism of conductivity enhancement in poly (3,4-ethylenedioxythiophene): poly (styrene sulfonate) film through solvent treatment," Polymer, 2004, vol. 45, pp. 8443-8450.

* cited by examiner

*Primary Examiner* — Mark Kopec
(74) *Attorney, Agent, or Firm* — Novak Druce Connolly Bove + Quigg LLP

(57) ABSTRACT

The present invention relates to novel processes for preparing an aqueous or nonaqueous dispersion or solution comprising at least one conductive polymer and at least one polyanion, characterized in that the polymerization is performed at a pressure below atmospheric pressure, to aqueous or nonaqueous dispersions or solutions prepared by this process and to the use thereof.

16 Claims, No Drawings

PROCESS FOR PRODUCING CONDUCTING POLYMERS

CROSS-REFERENCE TO RELATED APPLICATIONS

This application is a national stage application (under 35 U.S.C. §371) of PCT/EP2008/061213, filed Aug. 27, 2008, which claims benefit of German application 10 2007 041 722.7, filed Sep. 4, 2007.

BACKGROUND OF THE INVENTION

The invention relates to a novel process for preparing conductive polymers in the presence of polyanions, to aqueous or nonaqueous dispersions or solutions prepared by this process and to their use.

Conductive polymers are gaining increasing economic significance since polymers have advantages over metals with regard to processability, to weight and to the controlled adjustment of properties by chemical modification. Examples of known π-conjugated polymers are polypyrroles, polythiophenes, polyanilines, polyacetylenes, polyphenylenes and poly(p-phenylene-vinylenes). Layers of conductive polymers have various industrial uses, for example as a polymeric counterelectrode in capacitors, as an antistatic coating or for through-contacting of electronic circuit boards.

Conductive polymers are prepared by chemical or electrochemical, oxidative means from monomeric precursors, for example optionally substituted thiophenes, pyrroles and anilines and their respective derivatives which may be oligomeric. Especially chemically oxidative polymerization is widespread, since it is technically simple to achieve in a liquid medium and on various substrates.

A particularly important and industrially utilized polythiophene is poly(ethylene-3,4-dioxythiophene) (PEDOT or PEDT), which is prepared by chemically polymerizing ethylene-3,4-dioxythiophene (EDOT or EDT) and which, in its oxidized form, has very high conductivities and is described, for example, in EP 339 340 A2. An overview of numerous poly(alkylene-3,4-dioxythiophene) derivatives, especially poly(ethylene-3,4-dioxythiophene) derivatives, and the monomer units, syntheses and applications thereof is given by L. Groenendaal, F. Jonas, D. Freitag, H. Pielartzik & J. R. Reynolds, Adv. Mater. 12, (2000) p. 481-494.

Particular industrial significance has been gained by dispersions of PEDOT with polystyrenesulphonic acid (PSS), as disclosed, for example, in EP 0440 957. From these dispersions, it is possible to obtain transparent, conductive films which have found a multitude of applications. However, the conductivity of the layers obtained from these dispersions and the transmission of these layers is still too low in order, for example, to replace indium tin oxide (ITO) in touchscreens or organic light-emitting diodes. Layers of indium tin oxide (ITO) feature, for example, a conductivity of more than 5000 S/cm and, with a transmission of 90%, surface resistances between 5 and 20 ohms per square (ohm/sq) are achieved.

J. Y. Kim et al. showed that the use of polar high boilers can significantly enhance the conductivity of a PEDT/PSS film (J. Y. Kim et al., Synthetic Metals, 126, 2002, p. 311-316). The addition of dimethyl sulphoxide (DMSO) to a PEDT/PSS dispersion enhanced the conductivity by two orders of magnitude, specifically from 0.8 S/cm to 80 S/cm. The use of DMSO leads to transparent conductive films without haze, such that DMSO is very suitable as an additive for increasing conductivity. However, a conductivity of 80 S/cm is still insufficient in order, for example, to replace indium tin oxide (ITO) in touchscreens or organic light-emitting diodes.

JP 2006328276 enhances the conductivity of a PEDT/PSS dispersion through the use of succinimide, through which conductivities of 200-1000 S/cm can be achieved. However, succinimide is only of limited suitability for producing transparent, conductive layers, since it features a melting point of 123-135° C. and a boiling point of 285-290° C. Under customary drying conditions of 100-200° C., succinimide, unlike dimethyl sulphoxide, therefore remains in the final conductive film and forms crystalline regions there, which leads to haziness of the film. The high proportion of succinimide therefore leads a film. This procedure is therefore also unsuitable for obtaining transparent, high-conductivity layers.

JP 2001323137 discloses a PEDT synthesis in the presence of polyanions which is carried out under a nitrogen atmosphere.

EP 1323764 and WO 03048227 state that the polymerization of EDT in the presence of polyanions in a low-oxygen medium leads to an improved conductivity of the reaction product. In this process, it is important that the oxygen concentration at the time of addition of an initiator is less than 3 mg/l of reaction medium. The polymerization is then performed under atmospheric pressure. This process can produce conductive films which reach surface resistances of 2900 ohm/sq to 1200 ohm/sq. These surface resistances are likewise still insufficient in order to replace, for example, ITO in touchscreens or organic light-emitting diodes.

There was therefore still a need for processes for preparing conductive polymers which have a high electrical conductivity and a high transparency in the visible region, and which can be processed readily.

BRIEF SUMMARY OF THE INVENTION

It was thus an object of the present invention to provide such processes.

It has now been found that, surprisingly, conductive polymers have the abovementioned properties when the process for preparing them is performed at reduced pressure.

The present invention thus provides a process for preparing an aqueous or nonaqueous dispersion or solution comprising at least one conductive polymer and at least one polyanion, characterized in that the polymerization is performed at a pressure below atmospheric pressure. In this context, atmospheric pressure is understood to mean the mean air pressure of the atmosphere, which is 1013.25 hectopascal (hPa) at sea level.

The process according to the invention is based on reduction of the overall pressure in the reaction vessel before the start of the polymerization. In this context, reduced pressure is understood to mean that the pressure in the reaction vessel is less than the atmospheric pressure adjacent to the reaction vessel on the outside.

DETAILED DESCRIPTION OF THE INVENTION

In the context of the invention, conductive polymers may preferably be optionally substituted polypyrroles, optionally substituted polyanilines or optionally substituted polythiophenes. It may also be that mixtures of two or more of these conductive polymers are prepared by the process according to the invention.

Particularly preferred conductive polymers are optionally substituted polythiophenes comprising repeat units of the general formula (I)

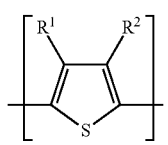

(I)

where
R¹ and R² are each independently H, an optionally substituted C₁-C₁₈-alkyl radical or an optionally substituted C₁-C₁₈-alkoxy radical, or
R¹ and R² together are an optionally substituted C₁-C₈-alkylene radical in which one or more carbon atoms may be replaced by one or more identical or different heteroatoms selected from O or S, preferably a C₁-C₈-dioxyalkylene radical, an optionally substituted C₁-C₈-oxythiaalkylene radical or an optionally substituted C₁-C₈-dithiaalkylene radical, or an optionally substituted C₁-C₈-alkylidene radical in which at least one carbon atom may optionally be replaced by a heteroatom selected from O or S.

In preferred embodiments, polythiophenes comprising repeat units of the general formula (I) are those comprising repeat units of the general formula (I-a) and/or of the general formula (I-b)

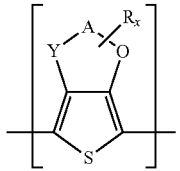

(I-a)

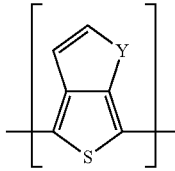

(I-b)

in which
A is an optionally substituted C₁-C₅-alkylene radical, preferably an optionally substituted C₂-C₃-alkylene radical,
Y is O or S,
R is a linear or branched, optionally substituted C₁-C₁₈-alkyl radical, preferably a linear or branched, optionally substituted C₁-C₁₄-alkyl radical, an optionally substituted C₅-C₁₂-cycloalkyl radical, an optionally substituted C₆-C₁₄-aryl radical, an optionally substituted C₇-C₁₈-aralkyl radical, an optionally substituted C₁-C₄-hydroxyalkyl radical or a hydroxyl radical,
x is an integer of 0 to 8, preferably 0, 1 or 2, more preferably 0 or 1, and
in the case that a plurality of R radicals is bonded to A, they may be the same or different.

The general formula (I-a) should be understood such that the substituent R may be bonded x times to the alkylene radical A.

In further preferred embodiments, polythiophenes comprising repeat units of the general formula (I) are those comprising repeat units of the general formula (I-aa) and/or of the general formula (I-ab)

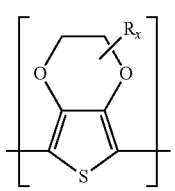

(I-aa)

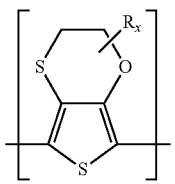

(I-ab)

in which
R is as defined above and x is an integer of 0 to 4, preferably 0, 1 or 2, more preferably 0 or 1.

The general formulae (I-aa) and (I-ab) should be understood such that the substituent R may be bonded x times to the ethylene radical.

In still further preferred embodiments, polythiophenes comprising repeat units of the general formula (I) are those comprising polythiophenes of the general formula (I-aaa) and/or of the general formula (I-aba)

(I-aaa)

(I-aba)

In the context of the present invention, the prefix "poly" should be understood such that more than one identical or different repeat unit is present in the polythiophene. The polythiophenes comprise a total of n repeat units of the general formula (I), where n may be an integer of 2 to 2000, preferably 2 to 100. The repeat units of the general formula (I) may each be the same or different within a polythiophene. Preference is given to polythiophenes comprising in each case identical repeat units of the general formula (I).

On the end groups, the polythiophenes preferably bear H in each case.

In particularly preferred embodiments, the polythiophene with repeat units of the general formula (I) is poly(3,4-ethylenedioxythiophene), poly(3,4-ethyleneoxythiathiophene) or poly(thieno[3,4-b]thiophene, i.e. a homopolythiophene composed of repeat units of the formula (I-aaa), (I-aba) or (I-b), where Y in the formula (I-b) in this case is S.

In further particularly preferred embodiments, the polythiophene with repeat units of the general formula (I) is a copolymer formed from repeat units of the formula (I-aaa) and (I-aba), (I-aaa) and (I-b), (I-aba) and (I-b), or (I-aaa), (I-aba) and (I-b), preference being given to copolymers formed from repeat units of the formula (I-aaa) and (I-aba), and also (I-aaa) and (I-b).

In the context of the invention, $C_1$-$C_5$-alkylene radicals A are methylene, ethylene, n-propylene, n-butylene or n-pentylene; $C_1$-$C_8$-alkylene radicals are additionally n-hexylene, n-heptylene and n-octylene. In the context of the invention, $C_1$-$C_8$-alkylidene radicals are $C_1$-$C_8$-alkylene radicals listed above comprising at least one double bond. In the context of the invention, $C_1$-$C_8$-dioxyalkylene radicals, $C_1$-$C_8$-oxythiaalkylene radicals and $C_1$-$C_8$-dithiaalkylene radicals are the $C_1$-$C_8$-dioxyalkylene radicals, $C_1$-$C_8$-oxylthiaalkylene radicals and $C_1$-$C_8$-dithiaalkylene radicals corresponding to the $C_1$-$C_8$-alkylene radicals listed above. In the context of the invention, $C_1$-$C_{18}$-alkyl represents linear or branched $C_1$-$C_{18}$-alkyl radicals, for example methyl, ethyl, n- or isopropyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl represents $C_5$-$C_{12}$-cycloalkyl radicals such as cyclopentyl, cyclohexyl, cycloheptyl, cyclooctyl, cyclononyl or cyclodecyl, $C_6$-$C_{14}$-aryl represents $C_6$-$C_{14}$-aryl radicals such as phenyl or naphthyl, and $C_7$-$C_{18}$-aralkyl represents $C_7$-$C_{18}$-aralkyl radicals, for example benzyl, o-, m-, p-tolyl, 2,3-, 2,4-, 2,5-, 2,6-, 3,4-, 3,5-xylyl or mesityl. In the context of the invention, $C_1$-$C_{18}$-alkoxy radicals are the alkoxy radicals corresponding to the $C_1$-$C_{18}$-alkyl radicals listed above. The above enumeration serves to illustrate the invention by way of example and should not be considered to be exclusive.

Optional further substituents of the above radicals include numerous organic groups, for example alkyl, cycloalkyl, aryl, halogen, ether, thioether, disulphide, sulphoxide, sulphone, sulphonate, amino, aldehyde, keto, carboxylic ester, carboxylic acid, carbonate, carboxylate, cyano, alkylsilane and alkoxysilane groups, and also carboxamide groups.

The abovementioned aqueous dispersions or solutions, preferably comprising 3,4-polyalkylenedioxythiophenes, can be prepared, for example, in analogy to the process described in EP 440 957. Useful oxidizing agents and solutions likewise include those listed in EP 440 957. In the context of this invention, an aqueous dispersion or solution is understood to mean a dispersion or solution which comprises at least 50 percent by weight (% by weight) of water, more preferably at least 90% by weight of water, and optionally solvents which are—at least partly—miscible with water, such as alcohols, e.g. methanol, ethanol, n-propanol, isopropanol, butanol or octanol, glycols or glycol ethers, e.g. ethylene glycol, diethylene glycol, propane-1,2-diol, propane-1,3-diol or dipropylene glycol dimethyl ether, or ketones, for example acetone or methyl ethyl ketone. In the aqueous dispersion or solution, the solids content of optionally substituted polythiophenes, especially of optionally substituted polythiophenes comprising repeat units of the general formula (I), may be between 0.05 and 3.0 percent by weight (% by weight), preferably between 0.1 and 1.0% by weight.

Processes for preparing the monomeric precursors for the preparation of the polythiophenes of the general formula (I) and derivatives thereof are known to those skilled in the art and are described, for example, in L. Groenendaal, F. Jonas, D. Freitag, H. Pielartzik & J. R. Reynolds, Adv. Mater. 12 (2000) 481-494 and literature cited therein.

In the context of the invention, derivatives of the thiophenes mentioned above are understood to mean, for example, dimers or trimers of these thiophenes. Higher molecular weight derivatives, i.e. tetramers, pentamers, etc., of the monomeric precursors are also possible as derivatives. The derivatives may be formed either from identical or different monomer units and be used in pure form or else in a mixture with one another and/or with the thiophenes mentioned above. In the context of the invention, oxidized or reduced forms of these thiophenes and thiophene derivatives are also encompassed by the term "thiophenes and thiophene derivatives", provided that their polymerization forms the same conductive polymers as in the case of the thiophenes and thiophene derivatives listed above.

The thiophenes may optionally be used in the form of solutions. Suitable solvents include in particular the following organic solvents which are inert under the reaction conditions: aliphatic alcohols such as methanol, ethanol, i-propanol and butanol; aliphatic ketones such as acetone and methyl ethyl ketone; aliphatic carboxylic esters such as ethyl acetate and butyl acetate; aromatic hydrocarbons such as toluene and xylene; aliphatic hydrocarbons such as hexane, heptane and cyclohexane; chlorohydrocarbons such as dichloromethane and dichloroethane; aliphatic nitriles such as acetonitrile, aliphatic sulphoxides and sulphones such as dimethyl sulphoxide and sulpholane; aliphatic carboxamides such as methylacetamide, dimethylacetamide and dimethylformamide; aliphatic and araliphatic ethers such as diethyl ether and anisole. In addition, it is also possible to use water or a mixture of water with the aforementioned organic solvents as the solvent. Preferred solvents are alcohols and water, and also mixtures comprising alcohols or water, or mixtures of alcohols and water. Thiophenes which are liquid under the oxidation conditions can also be polymerized in the absence of solvents.

The aqueous dispersion or solution may additionally comprise at least one polymeric binder. Suitable binders are polymeric organic binders, for example polyvinyl alcohols, polyvinylpyrrolidones, polyvinyl chlorides, polyvinyl acetates, polyvinyl butyrates, polyacrylic esters, polyacrylamides, polymethacrylic esters, polymethaciylamides, polyacrylonitriles, styrene/acrylic ester, vinyl acetate/acrylic ester and ethylene/vinyl acetate copolymers, poly-butadienes, polyisoprenes, polystyrenes, polyethers, polyesters, polycarbonates, polyurethanes, polyamides, polyimides, polysulphones, melamine-formaldehyde resins, epoxy resins, silicone resins or celluloses. The solids content of polymeric binder is between 0 and 3% by weight, preferably between 0 and 1% by weight.

The dispersion or solution may additionally comprise adhesion promoters, for example organofunctional silanes or hydrolysates thereof, for example 3-glycidoxypropyltrialkoxysilane, 3-aminopropyltriethoxysilane, 3-mercaptopropyltrimethoxysilane, 3-metacryloxypropyltrimethoxysilane, vinyltrimethoxysilane or octyltriethoxysilane.

In the context of the invention, the nonaqueous dispersions or solutions comprising at least one conductive polymer, preferably optionally substituted polythiophenes, and at least one polyanion can be prepared in analogy to the processes disclosed in EP 1 373 356:

In a first process step, aqueous or nonaqueous dispersions or solutions are prepared by the process according to the invention; in a second process step, a water-miscible solvent or a water-miscible solvent mixture is added to this aqueous dispersion or solution and then the water is removed at least partly from the resulting mixtures and optionally diluted with organic solvents. Useful solvents in this context are amidic solvents, for example formamide, N-methylacetamide, N,N-dimethylacetamide, N-methylpyrrolidone, N-methylcaprolactam or N-methylformamide, alcohols and ethers, for example ethylene glycol, glycerol, ethylene glycol dimethyl ether, ethylene glycol monomethyl ether, ethylene glycol monobutyl ether or dioxane. Preference is given to amidic solvents and solvents which possess a boiling point of more than 100° C. at standard pressure, and water-miscible solvents or water-miscible solvent mixtures which form an azeotrope with water. The water can be removed, for example, by membrane processes such as ultrafiltration, or by distillation. If there is dilution with organic solvents, preferred solvents are the above-mentioned solvents and aliphatic alcohols, for example methanol, ethanol, n-propanol, isopropanol, n-butanol, isobutanol, tert-butanol, amyl alcohol, isoamyl alcohol, neopentyl alcohol, aliphatic ketones, for example acetone, methyl ethyl ketone, methyl isobutyl ketone, methyl tert-butyl ketone, ethers, for example tetrahydrofuran, methyl tert-butyl ether, esters of aliphatic and aromatic carboxylic acids, for example ethyl acetate, butyl acetate, glycol monomethyl ether acetate, butyl phthalate, or aliphatic or aromatic hydrocarbons such as pentane, hexane, cyclohexane, octane, isooctane, decane, toluene, o-xylene, m-xylene or p-xylene.

The conductive polymers, especially the polythiophenes, may be uncharged or cationic. In preferred embodiments they are cationic, "cationic" relating only to the charges which reside on the polythiophene main chain. According to the substituent on the R radicals, the polythiophenes may bear positive and negative charges in the structural unit, in which case the positive charges are present on the polythiophene main chain and the negative charges, if present, on the R radicals substituted by sulphonate or carboxylate groups. The positive charges of the polythiophene main chain may be saturated partly or fully by anionic groups which may be present on the R radicals. Viewed overall, the polythiophenes in these cases may be cationic, uncharged or even anionic. Nevertheless, they are all considered to be cationic polythiophenes in the context of the invention, since the positive charges on the polythiophene main chain are crucial. The positive charges are not shown in formulae, since their exact number and position cannot be stated unambiguously. The number of positive charges is, however, at least 1 and at most n, where n is the total number of all repeat units (identical or different) within the polythiophene.

To compensate for the positive charge, if this is not already done by the optionally sulphonate- or carboxylate-substituted and thus negatively charged R radicals, the cationic polythiophenes require anions as counterions.

Useful counterions include monomeric or polymeric anions, the latter also referred to hereinafter as polyanions.

The monomeric anions used are, for example, those of $C_1$-$C_{20}$-alkanesulphonic acids, such as methane-, ethane-, propane- or butanesulphonic acid, or higher sulphonic acids, such as dodecanesulphonic acid, of aliphatic perfluorosulphonic acids, such as trifluoromethanesulphonic acid, perfluorobutanesulphonic acid or perfluoroctanesulphonic acid, of aliphatic $C_1$-$C_{20}$-carboxylic acids such as 2-ethylhexylcarboxylic acid, of aliphatic perfluorocarboxylic acids, such as trifluoroacetic acid or perfluorooctanoic acid, and of aromatic sulphonic acids optionally substituted by $C_1$-$C_{20}$-alkyl groups, such as benzenesulphonic acid, o-toluenesulphonic acid, p-toluenesulphonic acid, dodecylbenzenesulphonic acid, dinonylnaphthalenesulphonic acid or dinonylnaphthalenedisulphonic acid, and of cycloalkanesulphonic acids such as camphorsulphonic acid, or tetrafluoroborates, hexafluorophosphates, perchlorates, hexafluoroantimonates, hexafluoroarsenates or hexachloroantimonates.

Particular preference is given to the anions of p-toluenesulphonic acid, methanesulphonic acid or camphorsulphonic acid.

It is also possible for anions of the oxidizing agent used or anions formed therefrom after reduction to serve as counterions, such that addition of additional counterions is not absolutely necessary.

Preferred polymeric anions are, for example, anions of polymeric carboxylic acids, such as polyacrylic acids, polymethacrylic acids or polymaleic acids, or polymeric sulphonic acids, such as polystyrenesulphonic acids and polyvinylsulphonic acids. These polycarboxylic and polysulphonic acids may also be copolymers of vinylcarboxylic and vinylsulphonic acids with other polymerizable monomers, such as acrylic esters and styrene. They may, for example, also be partly fluorinated or perfluorinated polymers comprising $SO_3^-M^+$ or $COO^-M^+$ groups, where $M^+$ is, for example, $Li^+$, $Na^+$, $K^+$, $Rb^+$, $Cs^+$ or $NH_4^+$, preferably $H^+$, $Na^+$ or $K^+$.

A particularly preferred polymeric anion is the anion of polystyrenesulphonic acid (PSS) as the counterion.

The molecular weight of the polyacids which afford the polyanions is preferably 1000 to 2 000 000, more preferably 2000 to 500 000. The polyacids or their alkali metal salts are commercially available, for example polystyrenesulphonic acids and polyacrylic acids, or else are preparable by known methods (see, for example, Houben Weyl, Methoden der organischen Chemie [Methods of organic chemistry], Vol. E 20 Makromolekulare Stoffe [Macromolecular substances], part 2, (1987), p. 1141 ff.).

Cationic polythiophenes which comprise anions as counterions for charge compensation are also often referred to in the technical field as polythiophene/(poly)anion complexes.

In a preferred embodiment of the invention, the polymerization is performed at a pressure below 800 hPa. In a particularly preferred embodiment, the polymerization is effected at a pressure below 200 hPa and, in a very particularly preferred embodiment, the polymerization is performed at a pressure below 50 hPa.

The polymerization is performed preferably at a temperature within a range of 0-35° C., more preferably at a temperature within a range of 5-25° C. and most preferably at a temperature within a range of 10-20° C.

In order to enhance the conductivity of the aqueous or nonaqueous dispersions or solutions, it is possible in the context of the invention to add conductivity enhancers such as dimethyl sulphoxide. However, other conductivity enhancers as disclosed in EP 0686662 or by Ouyang et al., Polymer, 45 (2004), p. 8443-8450 can also be used as conductivity enhancers in the context of the invention.

The present invention further provides aqueous or nonaqueous dispersions or solutions which are prepared by the process according to the invention, and also the use of these aqueous or nonaqueous dispersions or solutions for producing conductive coatings. These conductive coatings may have a conductivity of greater than 500 S/cm.

The present invention still further provides a process for preparing an aqueous or nonaqueous dispersion or solution comprising at least one conductive polymer and at least one polyanion, characterized in that the process comprises the following steps:
1) adding at least one oxidizing agent only after the reaction medium has been inertized with the aid of inert gas,
2) performing the polymerization at a pressure below atmospheric pressure.

In the context of the invention, the reaction medium is considered to be inertized when the inert gas has been passed through the reaction medium for at least 5 minutes, preferably at least 20 minutes. Suitable inert gases are, for example, argon, helium or nitrogen. The reaction medium is considered to be inertized when the internal pressure of the reaction vessel has been lowered at least once and the internal pressure has subsequently been raised by adding inert gas.

This further process according to the invention encompasses all definitions, parameters, elucidations and process conditions specified in general or within areas of preference for the first process according to the invention mentioned, more particularly for at least one conductive polymer, at least one polyanion and for the pressure at which the polymerization is performed.

The invention still further provides an aqueous or nonaqueous dispersion or solution prepared by the further process according to the invention and the use of this aqueous or nonaqueous dispersion or solution for producing conductive coatings. These conductive coatings have a conductivity of at least 500 S/cm, preferably of at least 600 S/cm, most preferably of at least 700 S/cm.

The examples which follow serve merely to illustrate the invention by way of example and should not be interpreted as a restriction.

EXAMPLES

Example 1

Preparation of a PEDT:PSS Dispersion Using Nitrogen Atmosphere at Atmospheric Pressure (Comparative Example)

A 3 l stainless steel tank was equipped with a stirrer, a vent in the upper lid, a closable material inlet in the upper lid, a vent at the bottom and a heating jacket with attached thermostat. 2050 g of water, 500 g of polystyrenesulphonic acid solution (5.0%) and 5.6 g of a 10% iron(III) sulphate solution were added to the reaction vessel. The stirrer rotated at 50 revolutions/minute (rpm). The temperature was adjusted to 18° C. 200 l/h of nitrogen were admitted via the vent at the bottom for 3 hours and were able to escape through the opened material inlet. After 3 h, the nitrogen stream at the lower vent was shut down and a nitrogen stream of 500l/h was established at the upper vent. The nitrogen stream could escape through the material inlet. Subsequently, in a nitrogen countercurrent, 10.13 g of ethylenedioxythiophene (Baytron® M V2, H.C. Starck GmbH, Goslar) were introduced through the material inlet with the aid of a syringe. Subsequently, 23.7 g of sodium peroxodisulphate were added via the material inlet in the nitrogen countercurrent. The material inlet was closed. The polymerization was performed at a lightly elevated nitrogen pressure of 20 hPa in order to prevent ingress of atmospheric oxygen. The mixture was stirred at 18° C. for 23 h. After the reaction had ended, the mixture was transferred to a plastic beaker and inorganic salts were removed by adding 500 ml of a cation exchanger (Lewatit S100 H, Lanxess AG) and 290 ml of an anion exchanger (Lewatit MP 62, Lanxess AG). The mixture was stirred for 6 h and the ion exchanger was filtered off. Finally, the mixture was passed through a 10 µm filter. The resulting dispersion had a solids content of 1.19%.

Determination of the Conductivity 19 g of this dispersion were admixed with 1 g of dimethyl sulphoxide. A cleaned glass substrate was placed onto a spin coater and 10 ml of the abovementioned mixture were distributed on the substrate. Subsequently, the supernatant solution was spun off by rotating the plate. Thereafter, the substrate thus coated was dried on a hotplate at 130° C. for 15 min. The layer thickness was 70 nm (Tencor, Alphastep 500).

The conductivity was determined by applying silver electrodes of length 2.5 cm at a distance of 10 mm by means of a shadowmask. The surface resistance determined with an electrometer (Keithly 614) was multiplied by the layer thickness in order to obtain the electrical specific resistivity. The specific resistivity of the layer was 0.00265 ohm·cm. This corresponds to a conductivity of 377 S/cm. The layers thus produced are clear.

Example 2 (Inventive)

Preparation of a PEDT:PSS Dispersion Under Reduced Pressure

A 3 l stainless steel tank as described under Example 1 was used. 2050 g of water, 500 g of polystyrenesulphonic acid solution (5.0%) and 5.6 g of a 10% iron(III) sulphate solution were introduced into the reaction vessel. The stirrer rotated at 50 rpm. The temperature was adjusted to 60° C. and the internal pressure in the tank was lowered to 100 hPa. Over 16 h, the temperature was reduced to 18° C. As a result, the internal pressure was reduced to 33 hPa. Subsequently, in a nitrogen countercurrent, 10.13 g of ethylenedioxythiophene (Baytron® M V2, H.C. Starck GmbH, Goslar) were sucked into the reaction vessel through a tube. 23.7 g of sodium peroxodisulphate were dissolved in 50 g of water and likewise sucked into the reaction medium through the tube. The material inlet was closed and the internal pressure of the reaction vessel was adjusted to 30 hPa with the aid of the vacuum pump. The reaction was now carried out under this reduced pressure for 23 h. After the reaction had ended, the reaction vessel was vented and the mixture was transferred to a plastic beaker, and inorganic salts were removed by adding 500 ml of a cation exchanger (Lewatit S100 H, Lanxess AG) and 290 ml of an anion exchanger (Lewatit MP 62, Lanxess AG). The mixture was stirred for 6 h and the ion exchanger was filtered off. Finally, the mixture was passed through a 10 µm filter. The resulting dispersion had a solids content of 1.26%.

Determination of the Conductivity:

19 g of this dispersion were admixed with 1 g of dimethyl sulphoxide and, as described in Example 1, layers were applied to a glass substrate, and the conductivity was measured. The specific resistivity of the layer was 0.00265 ohm·cm. This corresponded to a conductivity of 377 S/cm. The layers thus produced are clear.

Determination of the Transmission 19 g of this dispersion were admixed with 1 g of dimethyl sulphoxide. A cleaned glass substrate was placed onto a spin-coater and 10 ml of the abovementioned mixture were distributed on the substrate. Subsequently, the supernatant solution was spun off by rotating the plate. Thereafter, the coated substrate was dried on a hotplate at 130° C. for 15 min. The layer thickness was 110 nm (Tencor, Alphastep 500).

In a photometer (Lambda 900), the transmission of the layer was determined in the 320-780 nm range. The transmission data were used to calculate the standard colour value Y for the illuminant D65/10°. The standard colour value was determined to be 86.52. The standard colour value of the glass substrate used was determined to be 90.94.

Example 3 (Inventive)

Preparation of a PEDT:PSS Dispersion Under Reduced Pressure Using Nitrogen to Degas the Reaction Mixture A 3 l stainless steel tank as described under Example 1 was used. 2050 g of water, 500 g of polystyrenesulphonic acid solution (5.0%) and 5.6 g of a 10% iron(III) sulphate solution were added to the reaction vessel. The stirrer rotated at 50 rpm. The temperature was adjusted to 18° C. 200 l/h of nitrogen were admitted via the vent at the bottom for 3 h and could escape via the opened material inlet. After 3 h, the nitrogen stream at the lower vent was stopped and a nitrogen stream of 500 l/h at the upper vent was established. The nitrogen stream could escape through the material inlet. Subsequently, in nitrogen countercurrent, 10.13 g of ethylenedioxythiophene (Baytron® M V2, H.C. Starck GmbH, Goslar) were introduced through the material inlet with the aid of a syringe. Subsequently, 23.7 g of sodium peroxodisulphate were added via the material inlet in a nitrogen countercurrent. The material inlet was closed and the internal pressure of the reaction vessel was immediately lowered to 30 hPa with the aid of a vacuum pump. The reaction was then carried out under this reduced pressure for 23 h. After the reaction had ended, the reaction vessel was vented and the mixture was transferred to a plastic beaker, and inorganic salts were removed by adding 500 ml of a cation exchanger (Lewatit S100 H, Lanxess AG) and 290 ml of an anion exchanger (Lewatit MP 62, Lanxess AG). The mixture was stirred for 6 h and the ion exchanger was filtered off. Finally, the mixture was passed through a 10 µm filter. The resulting dispersion had a solids content of 1.21%.

Determination of Conductivity 19 g of this dispersion were admixed with 1 g of dimethyl sulphoxide and, as described in Example 1, layers were applied to a glass substrate, and the conductivity was measured. The specific resistivity of the layer was 0.00142 ohm·cm. This corresponded to a conductivity of 704 S/cm. The layers thus produced are clear.

Determination of the Transmission 19 g of this dispersion were admixed with 1 g of dimethyl sulphoxide. A cleaned glass substrate was placed onto a spin-coater and 10 ml of the abovementioned mixture were distributed on the substrate. Subsequently, the supernatant solution was spun off by rotating the plate. Thereafter, the substrate thus coated was dried at 130° C. on a hotplate for 15 min. The layer thickness was 60 nm (Tencor, Alphastep 500).

In a photometer (Lambda 900), the transmission of the layer was determined in the 320-780 nm range. The transmission data were used to calculate the standard colour value Y for the illuminant D65/10°. The standard colour value was determined to be 87.21. The standard colour value of the glass substrate used was determined to be 90.94.

Example 4

Preparation of a PEDT:PSS Dispersion Under Standard Pressure without Using Nitrogen (Comparative Example)

A 3 l glass vessel was equipped with a stirrer. 2050 g of water, 500 g of polystyrenesulphonic acid solution (5.0%) and 5.6 g of a 10% iron(III) sulphate solution were added to the reaction vessel. The stirrer was rotated at 50 rpm. The temperature was adjusted to 18° C. Subsequently, 10.13 g of ethylenedioxythiophene (Baytron® M V2, H.C. Starck GmbH, Goslar) were added. Subsequently, 23.7 g of sodium peroxodisulphate were added. The polymerization was carried out under a standard atmosphere. The mixture was stirred at 18° C. for 23 h. After the reaction had ended, the mixture was transferred to a plastic beaker, and inorganic salts were removed by adding 500 ml of a cation exchanger (Lewatit S100 H, Lanxess AG) and 290 ml of an anion exchanger (Lewatit MP 62, Lanxess AG). The mixture was stirred for 6 h and the ion exchanger was filtered off. Finally, the mixture was passed through a 10 µm filter. The resulting dispersion had a solids content of 1.12%.

Determination of the Conductivity:

19 g of this dispersion were admixed with 1 g of dimethyl sulphoxide and, as described in Example 1, layers were applied to a glass substrate, and the conductivity was measured. The specific resistivity of the layer was 0.00877 ohm·cm. This corresponds to a conductivity of 114 S/cm. The layers thus produced are clear.

Example 5 (Inventive)

Preparation of a PEDT:PSS Dispersion with Preceding Addition of Oxidizing Agent and Subsequent Synthesis Under Reduced Pressure without the Use of Nitrogen A 3 l stirred tank as described under Example 1 was used. 2100 g of water, 500 g of polystyrenesulphonic acid solution (5.0%), 5.6 g of a 10% iron(III) sulphate solution and 23.7 g of sodium peroxodisulphate were added to the reaction vessel. The stirrer rotated at 50 rpm. The temperature was adjusted to 45° C. and the internal pressure in the tank was lowered to approx. 100 hPa. Over 1 h, the temperature was kept at 45° C. Subsequently, the temperature was lowered to 13° C. This lowered the pressure to 25 hPa. Subsequently, the apparatus was vented and 10.13 g of ethylenedioxythiophene (Baytron® M V2, H.C. Starck GmbH, Goslar) were added via the material inlet. The material inlet was closed and the internal pressure of the reaction vessel was lowered again to 30 hPa with the aid of the vacuum pump. The reaction was now carried out at 13° C. under this reduced pressure for 23 h. After the reaction had ended, the reaction vessel was vented and the mixture was transferred to a plastic beaker, and inorganic salts were removed by adding 500 ml of a cation exchanger (Lewatit S100 H, Lanxess AG) and 290 ml of an anion exchanger (Lewatit MP 62, Lanxess AG). The mixture was stirred for 6 h and the ion exchanger was filtered off. Finally, the mixture was passed through a 10 µm filter. The resulting dispersion had a solids content of 1.14%.

Determination of the Conductivity:

19 g of this dispersion were admixed with 1 g of dimethyl sulphoxide and, as described in Example 1, layers were applied to a glass substrate, and the conductivity was measured. The specific resistivity of the layer was 0.00192 ohm·cm. This corresponds to a conductivity of 520 S/cm. The layers thus produced are clear.

Table 1 shows a comparison of the conductivities of the layers comprising dispersions prepared according to Examples 1 to 5.

TABLE 1

| Example | Use of inert gas* | Pressure | Conductivity [S/cm] |
| --- | --- | --- | --- |
| Example 1 (comparative example) | yes | Atmospheric pressure | 377 |
| Example 2 | no | Reduced pressure | 377 |
| Example 3 | yes | Reduced pressure | 704 |
| Example 4 (comparative example) | no | Atmospheric pressure | 114 |
| Example 5 | no | Reduced pressure | 520 |

*The inert gas is used before the polymerization.

As is evident from the results in Table 1, the conductivity of the layers depends greatly on the preparation process for the conductive polymers. It becomes clear that the polymerization under reduced pressure leads to a fundamental improvement in the conductivity of the layers produced (see Examples 2, 4 and 5). When the polymerization is performed under inert conditions and under reduced pressure, the conductivity can be enhanced significantly, as is evident from Example 3.

The invention claimed is:

1. A process for preparing an aqueous or nonaqueous dispersion or solution comprising polymerizing at least one conductive polymer and at least one polyanion, at a pressure below atmospheric pressure.

2. The process according to claim 1, wherein said at least one conductive polymer is an optionally substituted polypyrrole, an optionally substituted polyaniline or an optionally substituted polythiophene.

3. The process according to claim 1, wherein said at least one conductive polymer is an optionally substituted polythiophene comprising repeat units of the general formula (I)

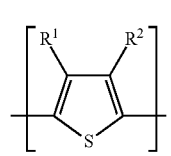

(I)

where
R$^1$ and R$^2$ are each independently H, an optionally substituted C$_1$-C$_{18}$-alkyl radical or an optionally substituted C$_1$-C$_{18}$-alkoxy radical, or
R$^1$ and R$^2$ together are an optionally substituted C$_1$-C$_8$-alkylene radical in which one or more carbon atoms are optionally replaced by one or more identical or different heteroatoms selected from O or S.

4. The process according to claim 3, wherein R$^1$ and R$^2$ together are an optionally substituted C$_1$-C$_8$-oxythiaalkylene radical or an optionally substituted C$_1$-C$_8$-dithiaalkylene radical, or an optionally substituted C$_1$-C$_8$-alkylidene radical in which at least one carbon atom may optionally be replaced by a heteroatom selected from O or S.

5. The process according to claim 1, wherein said at least one conductive polymer is a polythiophene comprising repeat units of the general formula (I-aaa) and/or of the general formula (I-aba)

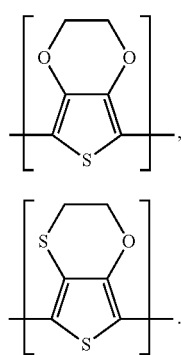

(I-aaa)

, (I-aba)

.

6. The process according to claim 1, wherein the polyanion is polystyrenesulphonic acid.

7. The process according to claim 1, wherein the polymerization is performed at a pressure below 800 hPa.

8. The process according to claim 1, wherein conductivity enhancers are added to the aqueous or nonaqueous dispersion or solution.

9. A process for preparing an aqueous or nonaqueous dispersion or solution comprising at least one conductive polymer and at least one polyanion, wherein the process comprises the following steps:
1) adding at least one oxidizing agent only after the reaction medium has been inertized with the aid of inert gas, and
2) performing the polymerization at a pressure below atmospheric pressure.

10. The process according to claim 9, wherein at least one conductive polymer is an optionally substituted polypyrrole, an optionally substituted polyaniline or an optionally substituted polythiophene.

11. The process according to claim 9, wherein at least one conductive polymer is an optionally substituted polythiophene comprising repeat units of the general formula (I)

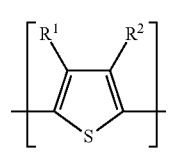

(I)

where
R$^1$ and R$^2$ are each independently H, an optionally substituted C$_1$-C$_{18}$-alkyl radical or an optionally substituted C$_1$-C$_{18}$-alkoxy radical, or
R$^1$ and R$^2$ together are an optionally substituted C$_1$-C$_8$-alkylene radical in which one or more carbon atoms may be replaced by one or more identical or different heteroatoms selected from O or S.

12. The process according to claim 11, wherein R$^1$ and R$^2$ together are an optionally substituted C$_1$-C$_8$-oxythiaalkylene radical or an optionally substituted C$_1$-C$_8$-dithiaalkylene radical, or an optionally substituted C$_1$-C$_8$-alkylidene radical in which at least one carbon atom may optionally be replaced by a heteroatom selected from O or S.

13. The process according to claim 9, wherein at least one conductive polymer is a polythiophene comprising repeat units of the general formula (I-aaa) and/or of the general formula (I-aba)

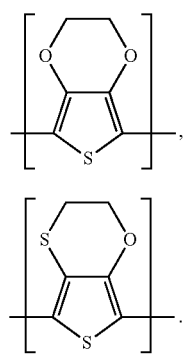

(I-aaa)

, (I-aba)

.

14. The process according to claim 9, wherein the polyanion is polystyrenesulphonic acid.

15. The process according to claim 9, wherein the polymerization is performed at a pressure below 800 hPa.

16. The process according to claim 9, wherein conductivity enhancers are added to the aqueous or nonaqueous dispersion or solution.

\* \* \* \* \*

UNITED STATES PATENT AND TRADEMARK OFFICE
CERTIFICATE OF CORRECTION

PATENT NO. : 8,663,505 B2  Page 1 of 1
APPLICATION NO. : 12/676530
DATED : March 4, 2014
INVENTOR(S) : Loevenich et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 785 days.

Signed and Sealed this

Twenty-ninth Day of September, 2015

Michelle K. Lee
*Director of the United States Patent and Trademark Office*